United States Patent [19]

Heindl et al.

[11] 4,447,305

[45] May 8, 1984

[54] PROCESS FOR OBTAINING LUMINESCENT GLASS LAYERS

[75] Inventors: Rudolf Heindl, Fontenay-aux-Roses; André Robert, Le Mesnil Saint Denis, both of, France

[73] Assignees: Commissariat a l'Energie Atomique; Centre National de la Recherche Scientifique, both of Paris, France

[21] Appl. No.: 367,390

[22] Filed: Apr. 12, 1982

[30] Foreign Application Priority Data

Apr. 15, 1981 [FR] France ............................ 81 07566

[51] Int. Cl.³ .............................................. C23C 15/00
[52] U.S. Cl. ......................... 204/192 C; 252/301.4 R; 252/301.4 F; 427/64; 427/65; 428/917
[58] Field of Search ................. 252/301.4 R, 301.4 F; 428/917; 204/192 C; 427/64, 65

[56] References Cited

U.S. PATENT DOCUMENTS

| | | | |
|---|---|---|---|
| 3,139,396 | 6/1930 | Sinclair | 204/298 |
| 3,388,053 | 6/1968 | Sinclair et al. | 204/298 |
| 3,725,238 | 4/1973 | Fishbein et al. | 204/298 |
| 3,912,611 | 10/1975 | Royer et al. | 204/192 P |
| 3,935,119 | 1/1976 | Barber et al. | 252/301.4 F |
| 3,979,273 | 9/1976 | Panzera | 204/192 C |
| 3,985,635 | 10/1976 | Adam et al. | 204/298 |
| 4,104,418 | 8/1978 | Park et al. | 427/42 |
| 4,269,919 | 5/1981 | Kuehnle | 204/192 P |
| 4,279,726 | 7/1981 | Baird et al. | 204/192 P |
| 4,297,387 | 10/1981 | Beal | 204/192 C |
| 4,312,915 | 1/1982 | Pan | 204/192 P |
| 4,336,117 | 6/1982 | Brainard et al. | 204/192 C |

FOREIGN PATENT DOCUMENTS

| | | |
|---|---|---|
| 2418483 | 10/1975 | Fed. Rep. of Germany . |
| 1244332 | 9/1960 | France . |
| 1252561 | 12/1960 | France . |
| 793635 | 4/1958 | United Kingdom . |
| 905391 | 9/1962 | United Kingdom . |

OTHER PUBLICATIONS

Anonymous, Perkin Elmer Brochure, #700-12, 1977.

Maissel Physics of Thin Films, vol. 3, 1966, Academic Press, N.Y., N.Y., pp. 98-100.
Mitsuyu et al., J. Crystal Growth, 41(1977), pp. 151-156.
Fraser, Proc. of IEEE, vol. 61, (1973), pp. 1013-1018.
Mohammadi, J. Electro. Soc. Solid-State Science & Technol., 1980, pp. 450-454.
Sinclair et al., Rev. Sci. Instruments, 33 (1962), pp. 744-746.
Hanak, Proc. 6th Internl. Vacuum Cong. 1974, Japan J. Appl. Phys. Suppl. 2, Pt. 1, 1974, p. 809.
Adams et al., Thin Solid Films, 72 (1980), pp. 335-339.
Krikorian, J. Vac. Sci. Techn., 12 (1975), pp. 186-187.
Hwang et al., Conf. Electrochem. Soc. Spring Meeting, May 9-14, 1982, Abstract #224.
Inoue et al., Conf. Intern. Electron Devices Technical Digest, Washington, D.C., Dec. 8-10, 1980, pp. 152-155.
M. Poulet et al., "An Air Light Guide, Plastic Scintillation Counter", *Nuclear Instruments and Methods*, 148 (1978), pp. 359-362.
S. Cella et al., "Module De Pulverisation Multimode Dans Des Conditions De Tres Haute Purete", *Le Vide, Les Coucher Minces.*

*Primary Examiner*—Arthur P. Demers
*Attorney, Agent, or Firm*—Kerkam, Stowell, Kondracki & Clarke

[57] ABSTRACT

Process for obtaining luminescent glass layers, application to the production of devices provided with said layers and to the construction of photoscintillators.

The process comprises projecting onto a support, by cathodic sputtering, the material of at least one target, each target including silica and at least one chemical compound able to give luminescent centers, such as a cerium oxide, so as to form at least one luminescent glass layer of the said support. The layer or layers formed preferably undergo a heat treatment such as annealing in order to increase the luminous efficiency thereof. It is in this way possible to form a scintillating glass layer on the previously frosted entrance window of a photomultiplier in order to obtain an integrated photoscintillator.

9 Claims, 3 Drawing Figures

PROCESS FOR OBTAINING LUMINESCENT GLASS LAYERS

BACKGROUND OF THE INVENTION

The present invention relates to a process for obtaining luminescent glass layers. It more particularly applies to the construction of devices equipped with at least one luminescent glass layer, such as certain illumination devices, cathode-ray tubes, image intensifier tubes, X-ray screens and television screens. It also applies to the construction of photoscintillators comprising a scintillating glass layer and a support, said layer being able to emit light by energy absorption and optionally coupled to a photodetector provided with an entrance window.

Photoscintillators of this type can be used more particularly for measuring α-particle emission rates of liquid acid solutions used in the preparation of actinides and for the continuous control of radioactive effluents from plants for the reprocessing of irradiated fuels from nuclear reactors.

It is frequently necessary to determine the α-particle emission rate of substances dissolved in a liquid, both in the field of research and in the nuclear industry. In the case where the solution to be studied is corrosive and in circulating, whilst simultaneously having α, β and/or γ radioactivities, the α-particle detection procedure utilizing a photoscintillator incorporating a scintillating glass layer optically coupled to the entrance window of a photodetector, such as a photomultiplier, has numerous advantages compared with other known α-particle detection methods, e.g. a good resistance of the glass (having a high $SiO_2$ content) to organic and inorganic reagents, such as a corrosive nitric acid solutions. This good resistance of the glass makes it possible to use a detection arrangement in which the scintillating glass layer placed against the entrance window of the photomultiplier is in direct contact with the investigated solution. As a result it is possible to illuminate systems provided with a fragile separating window, which is liable to deform. The photoscintillator is then no longer able to see the analysed solution portion under the same solid angle. Due to its robustness, such an arrangement has the advantage of being well adapted to a liquid circulation having flow rate and consequently pressure variations level with the scintillating glass layer.

In the case of a liquid which is at the same time an α, β and/or γ emitter, a good discrimination of the α-particles compared with the β-particles and/or the γ-photons can be obtained by limiting the liquid portion studied to a layer of limited thickness, namely of a few millimeters, in such a way that few β-particles and/or γ-photons are emitted, whilst giving to the scintillating glass layer thickness a value of the order of the path in the scintillating glass corresponding to the emission energy of the α-particles to be detected. This path can be less than 20 μm, e.g. approximately 10 to 15 μm.

However, the known processes for producing thin scintillating glass layers do not make it possible to reproducibly obtain such small values for the thickness of such layers. Thus, in particular, the process for melting a thin scintillating glass layer on a support makes it difficult to retain the initial contents of the glass in compounds responsible for the scintillation during the performance of this process and it is virtually impossible to obtain a layer thickness smaller than 300 μm, because by using too little material for producing the thin layer, its final composition (after melting or fusion) differs too greatly from the initial composition for obtaining a scintillating glass. Furthermore, mechanical abrasion of glass makes it possible to reduce the thickness of the latter to 250 μm and the results obtained by continuing this abrasion to about 40 microns, which is far from easy, are of a very arbitrary nature. Moreover, the thin layers obtained in this way are difficult to fix to the entrance window of a photomultiplier.

BRIEF SUMMARY OF THE INVENTION

The problem of the present invention is to obviate this disadvantage.

The invention therefore relates to a process for obtaining luminescent glass layers, wherein it consists of projecting onto a support, by cathodic sputtering, the material of at least one target, each target containing silica and at least one chemical compound able to give luminescent centres, in such a way as to form at least one luminescent glass layer on said support.

In this way, it is possible to reproducibly obtain thin luminescent glass layers with the desired thickness of e.g. approximately 10 to 20 microns.

One or more targets, each containing one or more chemical compounds able to give luminescent centres, can be used so as to form on the said support a single layer of a given luminescent glass or, successively, several layers or multilayer deposit formed from different luminescent glasses.

Thus, the material is projected by bombarding each target with material particles serving to detach the material from each of the targets. The material particles can be neutral or charged. They are, for example, ionized molecules of gases such as $O_2$ or $N_2$ or ionized atoms of rare gases, such as argon.

According to a special feature of the process according to the invention, the material is projected onto the support in a reducing atmosphere, formed e.g. by an inert gas such as argon, to which hydrogen is added. In the particular case of a said certain luminescent gas, the reducing atmosphere aids the formation of luminescent centres $Ce^{3+}$.

According to other special features, the process according to the invention also consists of performing a heat treatment, such as annealing of the layer or layers formed during the formation thereof, e.g. by heating the support or following the formation thereof. In the special case of a luminescent cerium glass, annealing, by placing most of the cerium atoms in the $Ce^{3+}$ state, makes it possible to considerably increase the quantity of light emitted by a luminescent glass layer formed, when it has absorbed energy.

The heat treatment can be performed in an inert atmosphere, e.g. an argon atmosphere, or in a reducing atmosphere, e.g. composed of an inert gas such as argon, to which hydrogen has been added.

According to another special feature of the process according to the invention, each chemical compound able to form luminescent centres comprising at least one element from the group of rare earths, can be cerium. (In the case of producing multilayer deposits, for example, several compounds based on different rare earths are used, whilst when producing a single luminescent glass layer, it is possible e.g. to see a cerium-based compound such as $CeO_2$ or $Ce_2O_3$ or even a mixture of these two oxides).

As stated hereinbefore, the process according to the invention is applicable to the production of photoscintillators incorporating a scintillating glass layer on a support, said layer (formed by the process according to the invention) being able to emit light by the absorption of energy and optically coupled to a photodetector provided with an entrance window. This photodetector is, for example, a photomultiplier.

The term scintillating glass is understood to mean a luminescent glass which, excited by energy absorption (e.g. in the form of $\alpha$ or $\beta$-particles or $\gamma$-photons) restores at least part thereof in light form, said restoration taking place during a very short time (generally less than $10^{-6}$ s), after the end of excitation.

A photoscintillator is, for example, used for the detection of $\alpha$ or $\beta$-particles or $\gamma$-photons.

The scintillating glass layer support can be the previously ground or frosted entrance window of the photodetector. (This window, which is transparent to the light which the scintillating glass layer may emit when it is excited consequently enables the photodetector to trap this light to convert it into electric current).

The scintillating glass layer support can also be transparent to the light which the scintillating glass layer is able to emit and which is to be optically coupled to the entrance window of the photodetector.

When the support has a polished face and frosted face, the scintillating glass layer is preferably deposited on the frosted face and is optically coupled to the entrance window of the photodetector via the polished face. Preferably, the scintillating glass layers undergoes surface metallization.

Finally, when the photoscintillator is intended for the study of $\alpha$-particles, the scintillating glass layer preferably has a thickness approximately of the passage in said scintillating glass layer corresponding to the emission energy of the $\alpha$-particles, so that the light resulting from the absorption of the $\beta$-particles (electrons or positrons) or $\gamma$-photons by the photoscintillator is negligible compared with that resulting from the absorption of the $\alpha$-particles.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
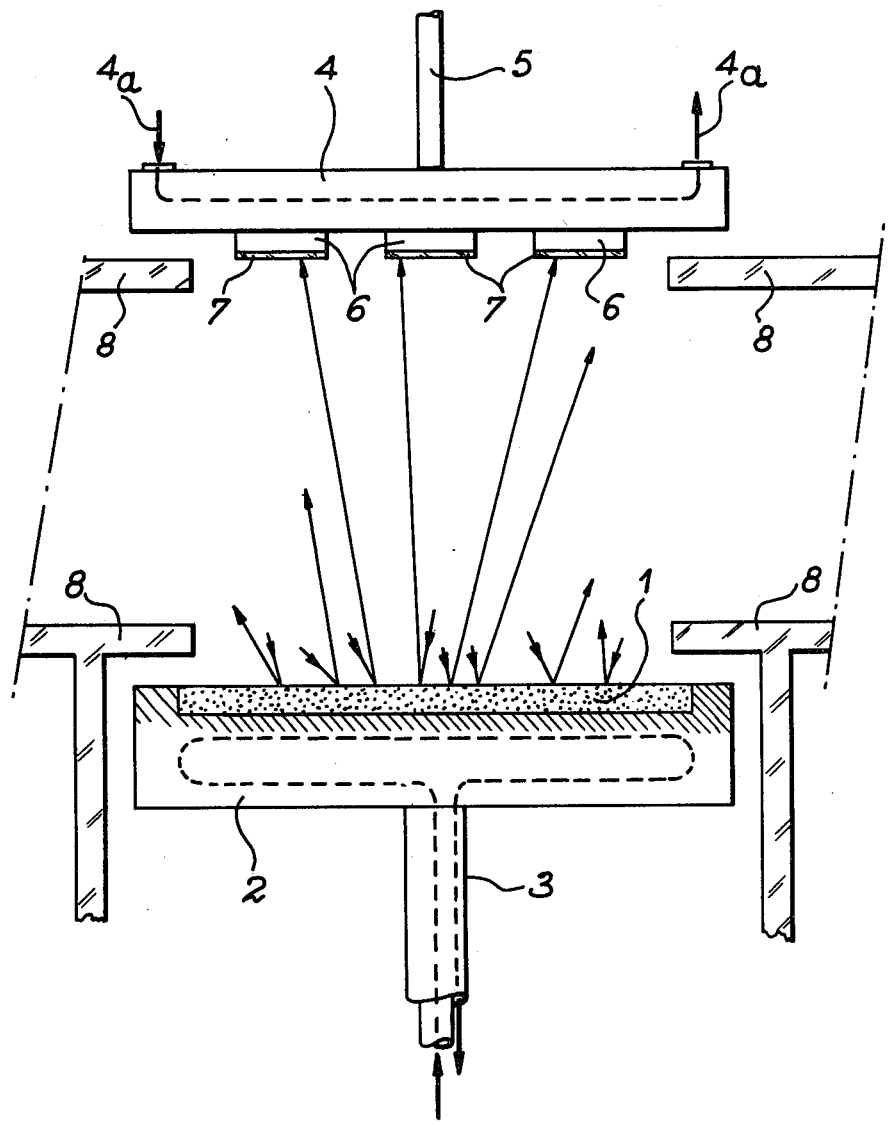
FIG. 1 a diagrammatic view of an installation for performing the process according to the invention.

FIG. 1 diagrammatically shows an installation for performing the process according to the invention. This installation makes it possible to form at least one luminescent glass layer on a support by a high frequency cathodic sputtering. In particular, it makes it possible to form a scintillating glass layer on a support for producing a photoscintillator, as will be shown hereinafter in connection with the description of FIGS. 2 and 3.

The high frequency cathodic sputtering installation for obtaining very high purity deposits is known in the art and described in the article by C. Stella and F. Jacques entitled "Module de pulvérisation multimode dans des conditions de très haute pureté" and published in the Journal "Le Vide—Les Couches Minces", supplement to No. 196, 1979, p. 211.

This installation comprises an enclosure (not shown in FIG. 1) in which an initial vacuum (prior to sputtering) of approximately $10^{-6}$ Pa is realized, for example, by means of a turbomolecular drag pump and is titanium sublimation pump (not shown in FIG. 1), so as to greatly reduce pollution due to impurities of the residual atmosphere. In the enclosure, the installation also comprises a target 1 of approximate diameter e.g. 8 cm and located in a target holder 2 raised to a very high frequency (e.g. 13 MHz) voltage of approximately 1500 to 2000 V by an electrode 3, also enabling the supply and removal of water for cooling target 1. There is also a substrate holder 4 earthed by a conductor 5, cooled by a water circulation 4a and which receives e.g. quartz substrates or supports 6 on which it is desired e.g. to form scintillating glass layers 7. There are also suppressions screens 8 covered with a thick deposit of pure silica and making it possible to reduce pollution due to parasitic sputtering operations, which would introduce disturbing impurities such as Fe, Ca, Na and K, which are poisons for the luminescence, into the layers to be formed.

Preferably, deposits are made on several supports at once and not on a single support, in order to increase the production efficiency.

Target 1 is constituted by a mixture of very pure silica powder and a luminophore (i.e. able to give luminescent centres) such as e.g. cerium oxide $Ce_2O_3$ or the oxide $CeO_2$ (or a mixture of both of these). However, it is obviously possible to use luminophores other than cerium. The cerium proportion in target 1 is approximately 1 to 6% by weight, e.g. 4%. It is also possible to add oxides of aluminium, magnesium or lithium to the target in order to aid the luminescence of the scintillating glass layers obtained. In addition, the lithium makes it possible to obtain scintillating glass layers usable in the production of photoscintillators for the detection of neutrons.

Cathodic sputtering is carried out in a mixture of an inert gas, such as argon, and hydrogen present in the mixture in a proportion of 5 to 10% by volume. The gases used preferably have a very high purity (N55). The pressure of the gaseous mixture during sputtering is between 0.1 and 1 Pa.

In per se known manner, a plasma containing argon $A^+$ ions is formed between target 1 and support 6 in the area of the enclosure defined by the suppression screens 8. The $A^+$ ions are attracted by target 1, strike the latter and sputter it, thus detaching the Si, O and Ce atom therefrom. These atoms are projected onto support 6 in order to form there layers 7. Provided that sputtering is satisfactorily performed, the composition of the layers 7 obtained corresponds to that of a scintillating glass containing 1 to 6% of cerium.

Hydrogen aids the formation of $Ce^{3+}$ ions (luminescent centres) in the scintillating glass, i.e. the disappearance of $Ce^{4+}$ ions, which are poisons for the luminescence. Sputtering is carried out for a few hours before forming the layers 7 in such a way that the substrate holder 4 is covered with silica, then the vacuum is broken and the support 6 introduced. The precautions taken in the production of the scintillating glass layer 7 (suppression screens 8, initial high vacuum) make it possible to obtain in the said layer a quantity of impurities of approximately a few parts per million.

It is possible to determine beforehand the thickness of the layers which it is desired to form. Thus, a high frequency power of about 300 W for target 1 (diameter approximately 8 cm) makes it possible, for example, to obtain a deposition rate of 0.2 μm/hour. Such a rate leads to good quality layers 7, i.e. which are compact and which adhere well to supports 6 and whose thickness can reach 10 to 20 μm.

The scintillating cerium glass layers 7 obtained, which only have a very limited luminescence when excited (e.g. by α-particles) also undergo heat treatment such as annealing in an inert atmosphere composed of a gas such as argon or nitrogen, or a reducing atmosphere composed of an inert gas and hydrogen (at a rate of 5 to 10% by volume of hydrogen) in a known and not shown gas scavenging furnace. In the said furnace, layers 7 on their supports 6 are, for example, heated to temperatures of approximately 700° to 1000° C. for 1 to 5 hours. This heat treatment makes it possible to eliminate most of the $Ce^{4+}$ ions, which are unfavourable to the luminescence, as has been indicated hereinbefore. Instead of performing this heat treatment in a furnace, it could also be performed in the enclosure during the formation of layers 7 by heating supports 6 to a temperature of about 500° to 1000° C.

In the installation shown in FIG. 1, it is possible to deposit not one, but several layers of different luminescent glasses in successive manner on the same support, by providing the same number of targets as there are layers to be formed, the targets being successively bombarded, or by using a single target, whose composition is changed after the deposition of one layer and before forming the next.

Instead of support 6, it is possible to place in the enclosure one or more photodetectors, such as photomultipliers, protected so as to only allow their entrance window to appear, so as to obtain scintillating glass layers directly on the entrance window (as will be shown hereinafter relative to FIG. 3). This leads to integrated detection assemblies. This is one of the advantages of the process according to the invention.

Figure 2:
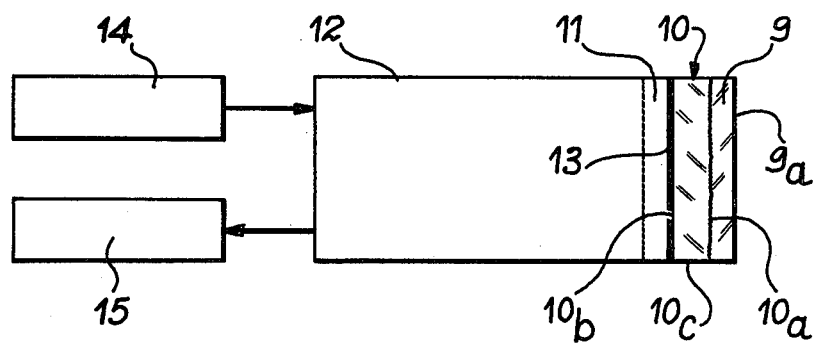
FIG. 2 a diagrammatic view of a special construction of a photoscintillator incorporating a scintillating glass layer obtained by the process according to the invention.

FIG. 2 diagrammatically shows a photoscintillator intended e.g. for the detection of α-particles and provided with an e.g. cerium scintillating glass layer 9 deposited on a quartz support 10 by the process according to the invention, in a cathode sputtering installation. (This layer has also been heat treated in the manner described hereinbefore). Moreover, the scintillating glass layer 9 is produced so as to have a thickness of approximately the path in the said scintillating glass corresponding to the emission energy of the incident α-particles, so as to obtain a selective detection of said particles.

The support 10, e.g. shaped like a plate, is optically coupled to the entrance window 11 of a photomultiplier 12 by means of a liquid 13, whose index is close to that of quartz and the glass constituting the entrance window 11. The liquid is, for example, a silicone oil. The photomultiplier 12 is obviously electrically connected to the high voltage supply means 14 and to electronic amplification, selection and counting means 15.

When support 10 has a frosted face 10a and a polished face 10b, layer 9 is preferably deposited on the frosted face 10a and support 10 is coupled to the entrance window 11 of the photomultiplier 12 by its polished face 10b, so as to aid the transmission of the liquid emitted by layer 9 to photomultiplier 12.

For the same reason, it is possible to deposit by a known process a reflecting metal layer of e.g. 500 to 1000 Å on the surface 9a of the scintillating glass layer 9. This reflecting metal layer is, for example, made from aluminium or preferably platinum, for a photoscintillator having to resist corrosive chemical agents. The light transmission is also improved by aiding the reflection of said light on the periphery of edge 10c of support 10, by metallization of the periphery or by giving the latter a shape permitting total light reflection.

It is also possible to improve and simplify the optical connection between the scintillating glass layer 9 and the photomultiplier 12 by directly depositing layer 9 on the previously frosted entrance window 11 of photomultiplier 12 by the process according to the invention. A photoscintillator 16 incorporating a scintillating layer 9 deposited on entrance window 11 is diagrammatically shown in FIG. 3. For the reasons indicated hereinbefore, layer 9 can undergo surface metallization.

Figure 3:
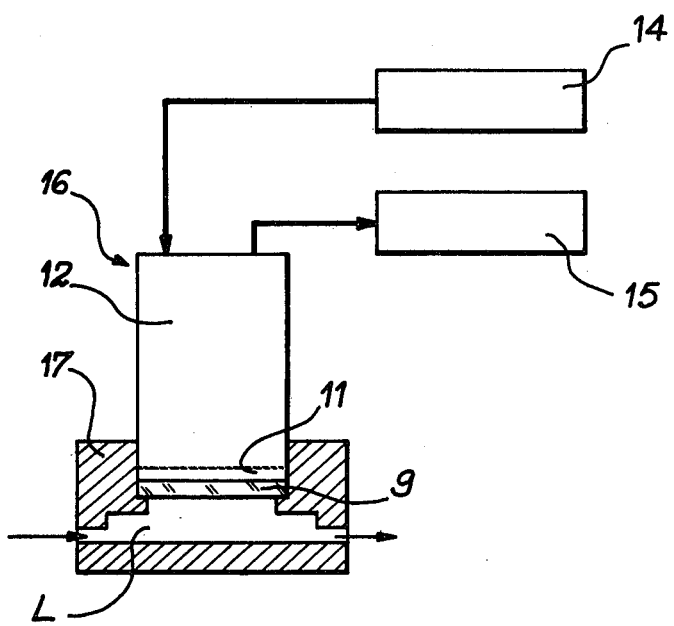
FIG. 3 diagrammatically a view of another special embodiment of a photoscintillator incorporating a scintillating glass layer formed, by the process according to the invention, directly on the entrance window of a photomultiplier incorporated into the photoscintillator.

In FIG. 3, the photoscintillator 16 serves, for example, to measure the α-particle emission rate of a radioactive, corrosive liquid L circulating in a not shown main pipe. The thickness of the scintillating glass layer 9 is approximately the passage in said scintillating glass corresponding to the emission energy of the α-particles in liquid L, i.e. a thickness of approximately 10 to 15 μm. Moreover, the photoscintillator 16 is fitted to a pipe 17 branched from the main pipe in such a way that the scintillating layer 9 is in contact with liquid L.

Thus, the process according to the invention makes it possible to reproducibly produce on an industrial scale thin luminescent glass layers with a thickness of e.g. 10 μm. It can be applied with particular advantage to the production of photoscintillators for the detection of α-particles requiring scintillating layers whose thickness must not exceed 10 to 15 μm for a good discrimination of said particles with respect to β-particles or γ-photons. Moreover, the resistance of the scintillating glass to most chemical agents means that the scintillating layers of these photoscintillators can be brought into direct contact with a corrosive, α-emitting liquid. Moreover, the process according to the invention makes it possible to produce integrated photoscintillators, the scintillating layer being directly deposited on the entrance window of photomultipliers.

What is claimed is:

1. Process for producing a photoscintillator, comprising projecting onto a support, by cathodic sputtering, the material of a target containing silica and at least one chemical compound able to give luminescent centers, in such a way as to form on said support a scintillating glass layer able to emit light by energy absorption, said support being transparent to said light and having a polished face and a frosted face, said scintillating glass layer being deposited on the frosted face and optically coupled to the entrance window of a photodetector by means of the polished face.

2. Process for producing a photoscintillator, comprising projecting onto a support, by cathodic sputtering, the material of a target containing silica and at least one chemical compound able to give luminescent centers, in such a way as to form on said support a scintillating glass layer able to emit light by energy absorption, said scintillating glass layer being optically coupled to a photodetector provided with an entrance window and the surface of the scintillating glass layer being metallized.

3. A process according to claim 2, wherein said support is a previously frosted entrance window of a photodetector.

4. A process according to claim 2, wherein the support is transparent to the light which the scintillating glass layer is able to emit and is optically coupled to the entrance window of the photodetector.

5. A process for producing a photoscintillator intended for the study of α-particles, comprising projecting onto a support, by cathodic sputtering, the material of a target containing silica and at least one chemical compound able to give luminescent centers, in such a way as to form on said support a scintillating glass layer able to emit light by energy absorption, said scintillating glass layer having the thickness of approximately the path in said scintillating glass corresponding to the emission energy of the α-particles and being optically coupled to a photodetector provided with an entrance window.

6. A process according to claim 5, wherein said support is a previously frosted entrance window of a photodetector.

7. A process according to claim 5, wherein the support is transparent to the light which the scintillating glass layer is able to emit and is optically coupled to the entrance window of the photodetector.

8. A process according to claim 7, wherein the support has a polished face and a frosted face, the scintillating glass layer is deposited on the frosted face and is optically coupled to the entrance window of the photodetector by means of the polished face.

9. A process according to claim 5, wherein the surface of the scintillating glass layer is metallized.

* * * * *